US008813004B1

(12) United States Patent
O'Riordan et al.

(10) Patent No.: US 8,813,004 B1
(45) Date of Patent: Aug. 19, 2014

(54) ANALOG FAULT VISUALIZATION SYSTEM AND METHOD FOR CIRCUIT DESIGNS

(71) Applicant: Cadence Design Systems, Inc., San Jose, CA (US)

(72) Inventors: Donald J. O'Riordan, San Jose, CA (US); Hao Ji, San Jose, CA (US); Joseph M. Swenton, Endicott, NY (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/683,889

(22) Filed: Nov. 21, 2012

(51) Int. Cl.
*G06F 17/50* (2006.01)
(52) U.S. Cl.
CPC .................. *G06F 17/5009* (2013.01)
USPC ............ 716/102; 716/100; 716/111; 716/112
(58) Field of Classification Search
CPC ..... G06F 9/455; G06F 17/50; G06F 17/5081; G06F 17/5068; G06F 17/5045; G06F 2217/04; G06F 2217/74; G06F 11/2257; G06F 2001/136254
USPC .................. 716/100, 102, 111, 112
See application file for complete search history.

(56) References Cited

U.S. PATENT DOCUMENTS

| | | | | |
|---|---|---|---|---|
| 4,937,765 | A | | 6/1990 | Shupe et al. |
| 5,084,824 | A | * | 1/1992 | Lam et al. ..................... 716/103 |
| 5,157,668 | A | * | 10/1992 | Buenzli et al. .................. 714/26 |
| 5,325,309 | A | * | 6/1994 | Halaviati et al. ................ 703/15 |
| 5,475,695 | A | * | 12/1995 | Caywood et al. ............. 714/738 |
| 6,009,251 | A | * | 12/1999 | Ho et al. ......................... 716/102 |
| 6,035,114 | A | | 3/2000 | Tseng et al. |
| 6,611,948 | B1 | | 8/2003 | Tyler et al. |
| 7,103,434 | B2 | * | 9/2006 | Chernyak et al. ............... 700/98 |
| 7,117,471 | B1 | * | 10/2006 | Li et al. ......................... 716/102 |
| 7,296,249 | B2 | | 11/2007 | Rinderknecht et al. |
| 7,472,051 | B2 | | 12/2008 | Mariani et al. |
| 7,562,321 | B2 | | 7/2009 | Wang et al. |
| 7,716,611 | B2 | * | 5/2010 | Pikus et al. ..................... 716/132 |
| 8,683,400 | B1 | * | 3/2014 | O'Riordan et al. ........... 716/106 |
| 2004/0060017 | A1 | | 3/2004 | Abdennadher |
| 2006/0041417 | A1 | | 2/2006 | Palladino |
| 2008/0276206 | A1 | | 11/2008 | Mariani |
| 2010/0229061 | A1 | | 9/2010 | Hapke et al. |
| 2010/0257494 | A1 | | 10/2010 | Pouarz et al. |
| 2013/0054161 | A1 | | 2/2013 | Hapke et al. |
| 2014/0059507 | A1 | | 2/2014 | Sunter |

OTHER PUBLICATIONS

Piet Engelke et al., "Resistive Bridging Fault Simulation of Industrial Circuits", Design, Automation and Test in Europe, Aug. 2008, p. 628-633.

Yuyun Liao and D.M.H. Walker, "Fault Coverage Analysis for Physically-Based CMOS Bridging Faults at Different Power Supply Voltages", Proceedings 1996 IEEE International Test Conference, Test and Design Validity, Washington, D.C., USA, Oct. 20-25, 1996, p. 767-775.

(Continued)

*Primary Examiner* — Sun Lin
(74) *Attorney, Agent, or Firm* — Kenyon & Kenyon LLP

(57) ABSTRACT

An apparatus and method for visualizing faults in a circuit design includes simulating faults for a circuit design in a layout and a schematic, editing the layout and schematic to include the simulated fault, and linking the layout and schematic with the fault simulation.

20 Claims, 4 Drawing Sheets

(56) References Cited

OTHER PUBLICATIONS

R. Rodriguez-Montanes, E.M.J.G. Bruls, J. Figueras, "Bridging Defects Resistance Measurements in a CMOS Process", Proceedings, IEEE International Test Conference 1992, Paper 41.3, 0-8186-3167, Aug. 1992, p. 892-899.

Vijay R. Sar-Dessai and D.M.H. Walker, "Resistive Bridge Fault Modeling, Simulation and Test Generation", Proceedings, 1999 IEEE ITC International Test Conference, Paper 23.2, 0-7803-5753, Jan. 1999, p. 596-605.

Bram Kruseman et al., "Defect Oriented Testing for Analog/Mixed-Signal Devices", 2011 IEEE International Test Conference, Paper 1.1, 978-1-4577-0152, Aug. 2011, p. 1-10.

Mei, Kenyon C.Y., "Bridging and Stuck-At Faults," IEEE Transaction on Computers, vol. c-23, No. 7, Jul. 1974, pp. 720-727.

Ferguson, F. Joel, et al., "Test Pattern Generation for Realistic Bridge Faults in CMOS ICs," IEEE International Test Conference, Oct. 1991, pp. 492-499.

Spinner, Stefan, et al., "Automatic Test Pattern Generation for Interconnect Open Defects," 26th IEEE VLSI Test Symposium, Apr. 2008, pp. 181-186.

Waicukauski, John A., et al., "Transition Fault Simulation," IEEE Design & Test of Computers, Apr. 1987, pp. 32-38.

Pomeranz, Irith, et al., "On n-Detection Test Sets and Variable n-Detection Test Sets for Transition Faults," in Proc. of VTS, Apr. 1999, pp. 173-180.

Geuzebroek, Jeroen, et al., "Embedded Multi-Detect ATPG and Its Effect on the Detection of Unmodeled Defects," IEEE ITC, Oct. 2007, paper 30.3, pp. 1-10.

Cho, Kyoung Youn, et al., "Gate Exhaustive Testing," IEEE, ITC, paper 31.3, Nov. 2005, pp. 1-7.

Hapke, F., et al., "Defect-Oriented Cell-Aware ATPG and Fault Simulation for Industrial Cell Libraries and Designs," IEEE ITC, Nov. 2009, paper 1.2, pp. 1-10.

Hapke. F., et al., "Cell-Aware Production Test Results From a 32-nm Notebook Processor," IEEE ITC, Nov. 2012, paper 1.1, pp. 1-9.

\* cited by examiner

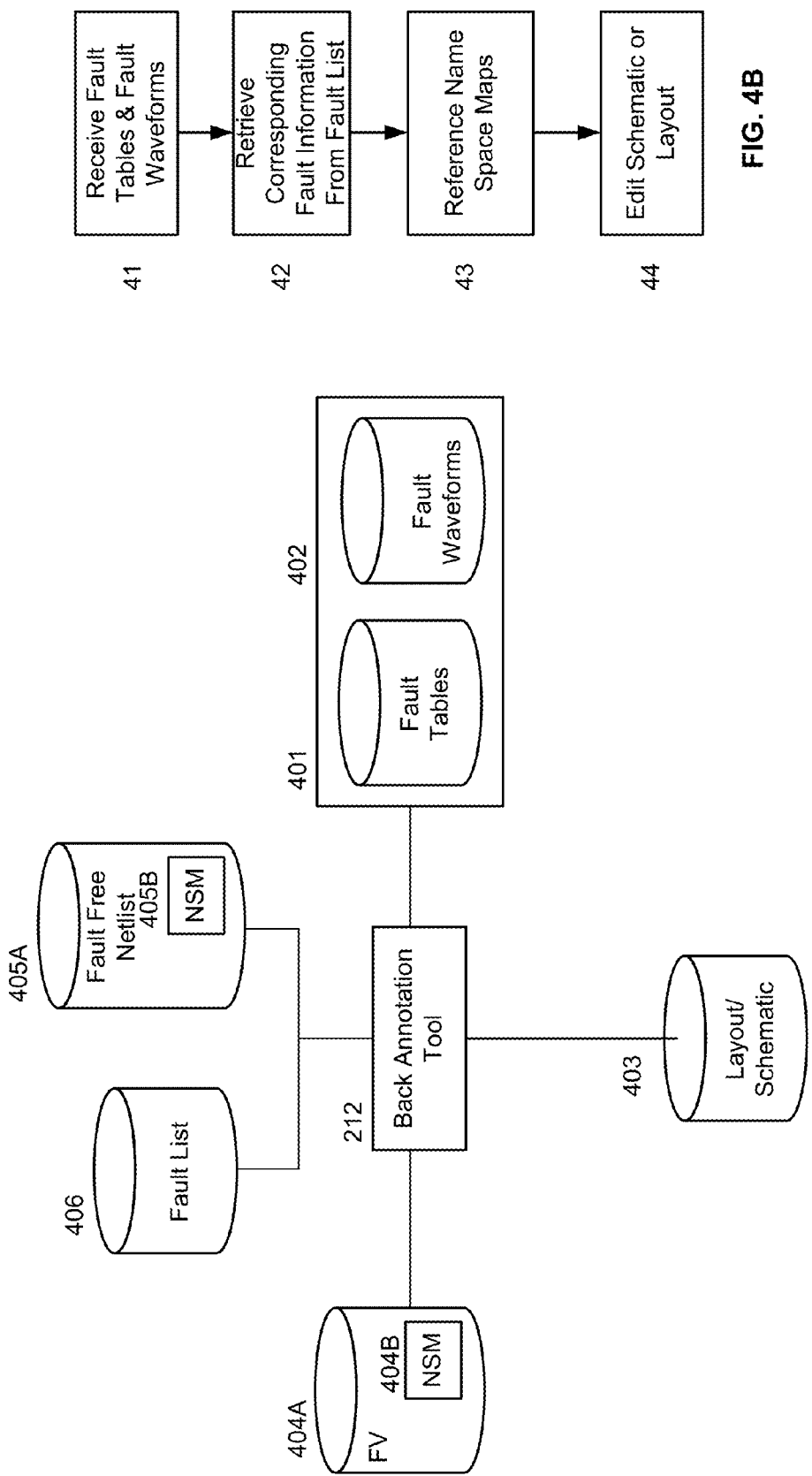

ANALOG FAULT VISUALIZATION SYSTEM AND METHOD FOR CIRCUIT DESIGNS

CROSS REFERENCE TO RELATED APPLICATIONS

The present application is related to U.S. application Ser. No. 13/683,810, entitled "System and Method For Fault Sensitivity Analysis Of Mixed-Signal Integrated Circuit Designs", filed on the same day as the present application. This related application is hereby incorporated by reference in its entirety.

The present application also is related to U.S. application Ser. No. 13/683,853, entitled "System and Method For Fault Sensitivity Analysis Of Digitally-Calibrated-Circuit Designs", filed on the same day as the present application. This related application is hereby incorporated by reference in its entirety.

BACKGROUND

The integrated circuit ("IC") industry faces the challenge of reducing yield loss caused by defects during manufacturing. These defects can be either random defects or systematic defects. Random defects, as the name implies, result from random occurrences such as particulate contamination. Systematic defects are non-random and result from problems with the manufacturing process and/or IC design. Systematic defects will reoccur when a manufacturer uses a similar process or IC design. A designer may be able to categorize or anticipate certain systematic defects based on a shape or feature pattern on an IC.

As the IC industry moves to smaller IC features, an increasing number of various subtle design processes exist for manufacturing the ICs. Each subtle design process may cause unique systematic defects, thus increasing the number and type of systematic defects present in a manufactured IC. Circuit designers use a combination of various tools to reduce these systematic defects. While these tools help designers to account for systematic defects during the IC design process, the tools are often poorly integrated, if integrated at all, thus making designing robust fault free ICs difficult. Designers need a fault diagnostic system which allows for conducting fault analysis and visualization of the simulated faults in a schematic or layout.

BRIEF DESCRIPTION OF THE DRAWINGS

FIG. 4A is an exemplary block diagram of the databases that a back annotation tool references or edits according to an embodiment.

FIG. 4B is an exemplary flow chart of implementation of a back annotation tool according to an embodiment

DETAILED DESCRIPTION

As will be described hereinafter in greater detail, one aspect of the present invention relates to an analog fault visualization system and method by extracting data from a schematic and/or layout; creating a netlist; creating a fault list; simulating faults; and providing the faults in a schematic and/or layout editor for visualization, debugging, and/or modification. For purposes of explanation, specific nomenclature is set forth to provide a thorough understanding of the present invention. Description of specific applications and methods are provided only as examples. Various modifications to the embodiments will be readily apparent to those skilled in the art and the general principles defined herein may be applied to other embodiments and applications without departing from the spirit and scope of the invention. Thus the present invention is not intended to be limited to the embodiments shown, but is to be accorded the widest scope consistent with the principles and steps disclosed herein.

Figure 1:
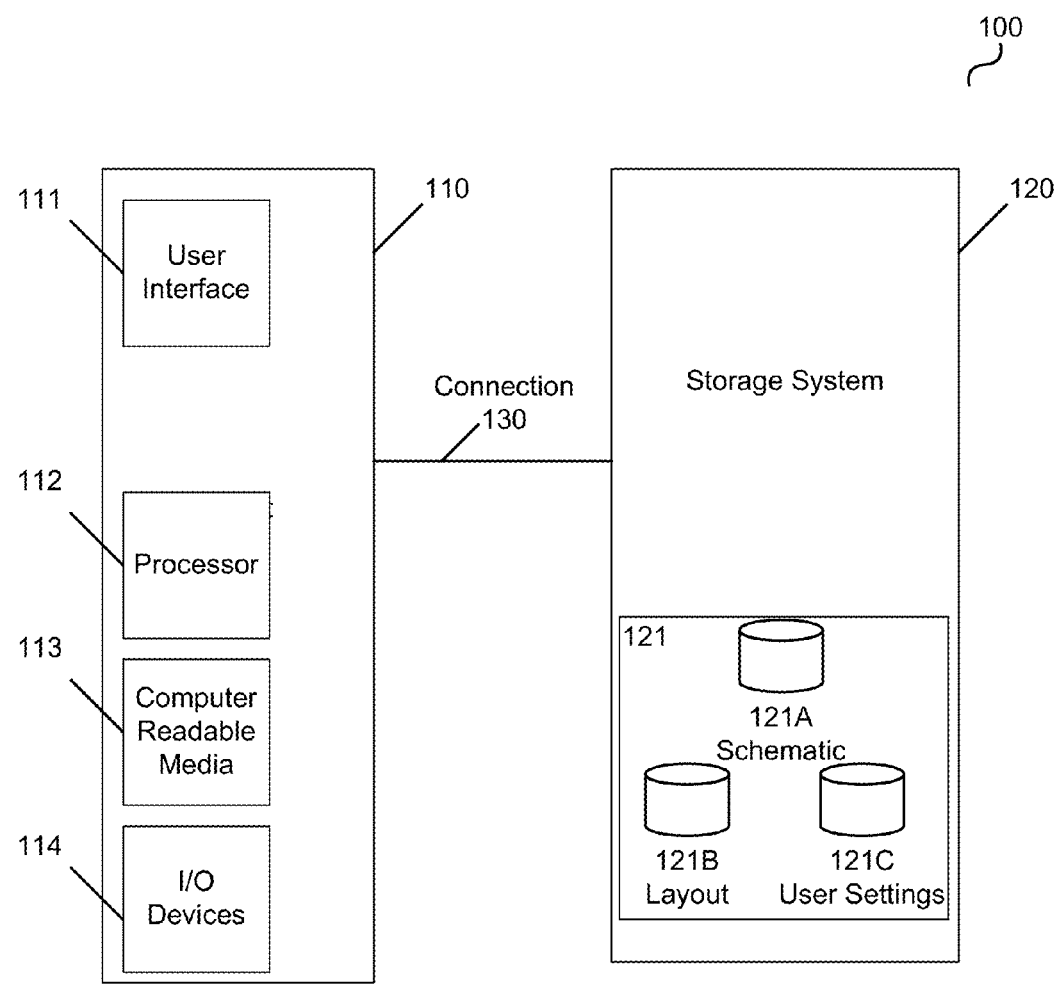
FIG. 1 is a block diagram illustrating components of an exemplary fault analysis visualization system according to an embodiment.

FIG. 1 is a block diagram illustrating components of an exemplary analog fault visualization system 100 according to an embodiment. This system may provide simulator functionality, as will be discussed in greater detail below. A user may access the analog fault visualization system through a standalone client system, client-server environment, or a network environment. System 100 may comprise one or more clients or servers 110, one or more storage systems 120, and one or more connection 130 between and among these elements.

Client 110 may execute instructions stored on a computer readable medium that provides a user interface 111 which allows a user to access storage system 120. According to an aspect of an embodiment, the instructions may be part of a software program or executable file that operates Electronic Design Automation (EDA) software. Client 110 may be any computing system, such as a personal computer, workstation, or other device employing a processor which is able to execute programming instructions. User interface 111 may be a GUI run in a user-controlled application window on a display. A user may interact with user interface 111 through one or more input/output (I/O) devices 114 such as a keyboard, a mouse, or a touch screen.

Storage system 120 may take any number of forms, including but not limited to a server with one or more storage devices attached to it, a storage area network, or one or a plurality of non-transitory computer readable media. In an aspect of one embodiment, databases 121 may be stored in storage system 120 such that they may be persistent, retrieved, or edited by the user. Databases 121 may include a schematic database 121A, a layout database 121B, and a user settings database 121C. Databases 121 may also include other databases not listed but used in the system such as a netlist database, fault database, etc. These databases may be kept as separate files or systems, or may be merged together in any appropriate combination.

According to an aspect of an embodiment, only one client 110 is connected to storage system 120 through connection 130, which may be a simple direct wired or wireless connection, a system bus, a network connection, or the like, to provide client 110 with access to storage system 120. In another aspect, connection 130 may enable multiple clients 110 to connect to storage system 120. The connection may be port of a local area network, a wide area network, or another type of network, again providing one or more clients with access to storage system 120. Depending on system administrator settings, client 110's access to system storage 120 or to other clients may be limited.

Figure 2:
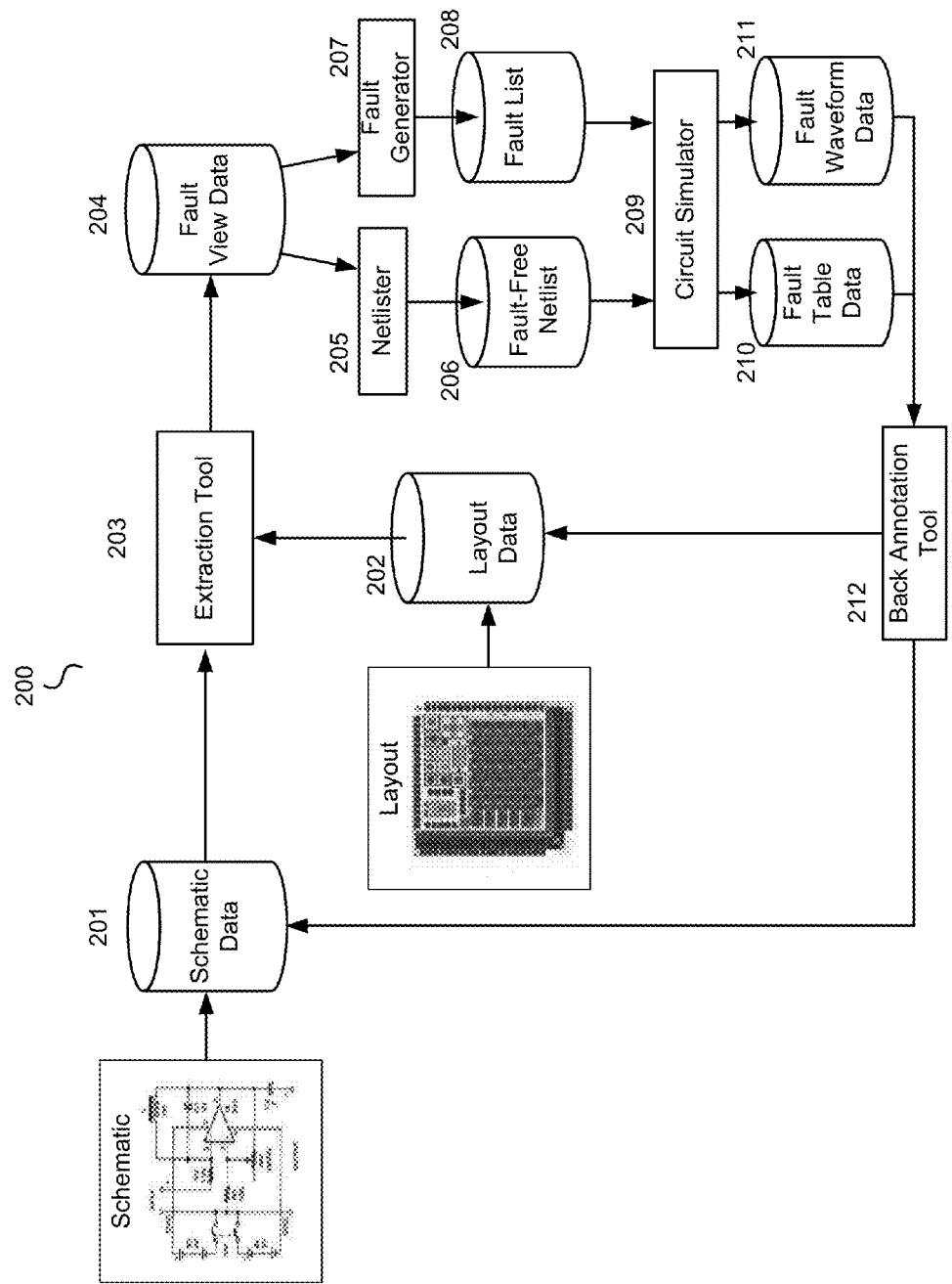
FIG. 2 is a block diagram illustrating an embodiment of a fault analysis visualization method.

FIG. 2 is a block diagram illustrating one method of implementing the analog fault visualization system 200. Analog fault visualization system 200 begins by receiving a data representation of a circuit design in the form of schematic data 201 and layout data 202. Schematic data 201 may describe all of the electrical components and their relationships within the circuit design. Layout data 202 may describe the physical representation, including the specific shapes and geometric elements, of the circuit design for manufacturing.

An extraction tool 203 extracts information from schematic data 201 and layout data 202. Extraction tool 203 may extract the data for particular shapes and geometric elements associated with higher probability of faults from layout data 202. Extraction tool 203 may also extract devices, such as transistors, resistors, capacitors, inductors, diodes, or any other fundamental circuit elements, and their connectivity from schematic data 201, and may combine the data extracted from schematic data 201 and layout data 202 to create fault view data 204. In one embodiment, extraction tool 203 may combine all the information in schematic data 201 with layout data 202 to create fault view data 204. Schematic data 201, layout data 202, and fault view data 204 may be in an EDA data format such as those used in OpenAccess, GDSII, OASIS, SEMI, Milkyway, or EDDM. It is within the contemplation of the invention to employ any other desired format as the EDA data format. Different data formats have certain naming conventions and rules, commonly referred to as a "namespace." Different data format may use different namespaces and may have rules which make device names from one space to another incompatible. For example, one namespace may use the "-" character in a device name but another namespace may reserve the "-" character for other functions. Thus, device name "node-1" may be incompatible with certain namespaces. Some examples of namespaces are CDBA, CDBAFlat, Spectre, and SPICE. This exemplary listing is not intended to be exhaustive or limiting. The proper focus is on the more general namespace concept, rather than any particular namespace.

Additionally, when extraction tool 203 creates fault view data 204, it may group or expand similar devices. Multiples of a device connected in parallel ("m-factored devices") or in series ("s-factored devices") may be grouped together. For example, there may be three separate instances of a resistor connected in parallel named A__1, A__2, and A__3 which are grouped as a single device A_m3. Thus, in one database, a group of resistors may have unique names, while another database may use a single name for the group. As a result, these databases may use different namespaces.

In one embodiment, schematic data 201, layout data 202, and fault view data 204 use the same namespace. Fault view data 204 may contain information that maps grouped devices to their extracted counterparts. In another embodiment, different namespaces may be used, and extraction tool 203 may conduct a namespace transformation. In such a case, fault view data 204 may track and map the transformation. For example, "node-1" may be mapped to "node__1." In one embodiment, extraction tool 203 may be a parasitic extractor tool.

Netlister 205 is a tool that transforms a connectivity source such as a schematic or layout into a textual netlist. A netlist may be a textual coded description of every element, part, device, and connection in the schematic/layout. EDA tools commonly use netlists for simulating circuitry. In one embodiment, netlister 205 uses the information in fault view data 204 to create fault free netlist 206 which is a netlist of the original schematic/layout. When the netlister transforms a schematic/layout into a netlist, the namespace of the netlist may differ from the schematic/layout. In one embodiment, fault free netlist 206 may also store a namespace map between fault view data 204 and fault free netlist 206. In one embodiment, certain devices in the schematic or layout may be grouped in the fault-free netlist 206 depending on the type of fault analysis implemented. For example, if a user is only simulating bridge faults, an m-factored device may be reduced to a single device in netlist 206 because a short in a parallel circuit will effectively short the entire group of m-factored devices. In this case, netlist 206 may contain a namespace map for the grouped devices.

Fault generator 207 uses information in fault view data 204 to generate fault list 208. Fault list 208 may be in the same namespace as fault-free netlist 206. In an alternative embodiment, fault generator 207 may be integrated with extraction tool 203. Fault generator 207 may use one or more algorithms for generating fault list 208. For example, faults may be generated using a fault generation algorithm such as RC based bridge pair extraction, inductive fault analysis, DFM Aware Bridge Pair Extraction, etc.

Figure 3:
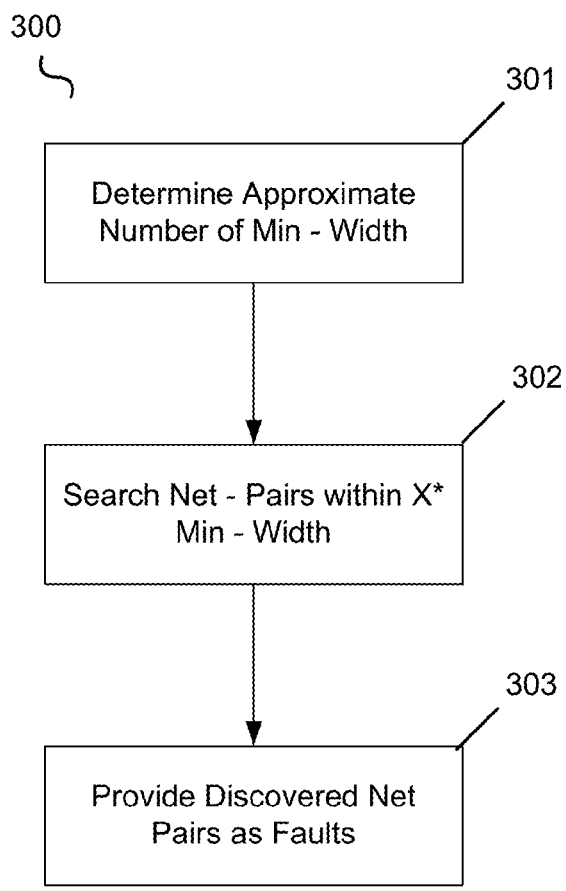
FIG. 3 is an exemplary flow chart of a fault generator using inductive fault analysis.

FIG. 3 is an exemplary flow chart depicting one implementation of a fault generator using one method of inductive fault analysis. At 301, fault generator 300 determines an approximation of the min-width spacing rules for the circuit. Min-width is the minimum distance that must separate features, shapes, or geometries from each other for manufacturing. Fault generator 300 may approximate min-width by identifying the shortest feature spacing in the design layout. In another embodiment, min-width may be provided in a constraint specification provided by an IC manufacturer.

At 302, fault generator 300 may search the design layout for net pairs that are within a multiple of min-width distance of each other. A user input or predetermined default value may be used as the multiple.

At 303, fault generator 300 provides the resulting net pairs as faults in a fault list. In one embodiment, a user may limit the number of faults that fault generator 300 provides. In yet another embodiment, fault generator 300 may be encoded to provide a limited number of faults. If the fault limit is less than the number of faults that fault generator 300 detects, fault generator 300 may provide faults based on the probability of a defect. Fault generator 300 may determine the likelihood of a defect by analyzing the parallel run lengths of the resultant net pairs. The longer the parallel run length, the more likely it is that a defect will occur. In another embodiment, fault generator 300 may compute defect probabilities for a net pair by utilizing defect density equations or coefficients provided by an IC manufacturer.

Referring back to FIG. 2, fault generator 207 may provide a description of every generated fault as fault list 208. Fault list 208 may contain a unique name of every fault generated, the type of fault, and the fault's parameters. For example, one of the generated faults may be a bridge fault. A bridge fault occurs when separate nodes are shorted together due to a defect. Fault list 208 may provide a unique name for the bridge fault and the nodes that are affected by the bridge fault, i.e., the two nodes that are shorted, and a resistance value between the nodes.

The type of information about a fault may vary from fault type to fault type. For instance, fault list 208 may contain an open fault which was generated by fault generator 207. Open faults occur when a connection in a node is split into two, the original node and a fault node. Fault list 208 may specify the resistance between the original node and the fault node and which terminal for each instance is connected to which node. In one embodiment, fault list 208 may provide a numerical terminal list for each terminal of each instance. Fault list 208 may provide terminal numbers to determine which terminals are connected to the fault node. In one embodiment, fault list 208 may be in a format similar to a netlist such that a tool may use fault list 208 for simulation.

Simulator 209 references fault free netlist 206 and fault list 208 to conduct a fault sensitivity analysis on the circuit design. Simulator 209 may use the fault free netlist 206 to simulate the circuit design while including one or more faults in fault list 208. Simulator 209 may continue to conduct circuit simulations of the circuit design until a circuit response is provided for every fault. Simulator 209 may create a fault table dataset 210, which may contain the solution values for each fault from the simulation. The list of faults and corresponding simulation results may be displayed as a table on a GUI in connection with other EDA software. Simulator 209 may also create fault waveform dataset 211, which contains information for creating a graphical representation of electrical signals in a circuit against time. Tools such as a waveform viewer may use the fault waveform dataset to display the waveform. As noted earlier, the system 100 in FIG. 1 may function as a simulator, among other things.

Back annotation tool 212 may annotate/edit a circuit design schematic or layout to include faults from fault table 210 or from fault list 208. Back annotation tool 212 may also be used to link a fault in fault table dataset 210, and/or fault list 208 and/or a waveform in waveform dataset 211 to the corresponding annotations in the schematic and/or layout. Back annotation tool 212 may identify the particular node in the schematic that corresponds to a user selected waveform from waveform dataset 211. Back annotation tool 212 may also identify shapes in the layout associated with the corresponding fault nodes when a user selects a fault from fault table dataset 210 or fault list 208.

FIG. 4A diagrams the databases that back annotation tool 212 of FIG. 2 references or edits according to an embodiment. Database 401 and 402 contain fault tables and fault waveforms which may be provided by a circuit simulation tool. Database 403 is a schematic or layout database which contains information regarding a circuit design in a particular data format. Database 404A is a fault view (FV) database which may be partly created from database 403. Database 404A may be in the same data format as database 403 and may use the same namespace. Alternatively, database 404A may use a different namespace from database 403 and may contain namespace mapping (NSM) 404B between the namespace(s) used in databases 403 and 404A. Database 405A is a fault free (FF) netlist database which contains namespace mapping 405B between the netlist data and the fault view data. Database 406 is a fault list database which contains information regarding the faults used by a circuit simulation tool to create database 401 and 402. Database 406 may contain the node and connectivity information for each fault.

FIG. 4B is a flow chart for implementation of a back annotation tool according to an embodiment. At 41, the back annotation tool may retrieve or receive fault tables and fault waveforms for a particular schematic or layout. At 42, the back annotation tool may retrieve or receive information regarding individual faults within the fault list database corresponding to the faults in the fault table and waveforms. The information may include connection information regarding each fault and the respective nodes that are affected. At 43, the back annotation tool may reference the namespace map in the netlist database and fault view database to translate the faults and nodes from the fault list to the data format of the schematic or layout database. At 44, the back annotation tool may edit the schematic or layout database to include faults in the original schematic or layout. When a layout or schematic editor displays the circuit design on a GUI using the edited layout/schematic database, the circuit design may also display faults integrated into the circuit. In one embodiment, two annotation tools are used, one for editing a layout and the other for editing a schematic. In one embodiment, instead of each database containing name mappings, each database may use well known namespaces such as CDBA, CDBAFlat, Spectre, SPICE, etc. and may use a name mapping utility to map names from one namespace to another.

In one embodiment, the back annotation tool may take advantage of certain characteristics of a schematic or layout database to present faults on a schematic or layout. For example, some databases use marker objects for indicating design violations. The oaMarker object in OpenAccess is one such marker object. In one embodiment, the back annotation tool may replace shapes in a layout with oaMarker objects to indicate a fault.

While particular embodiments of the present invention have been described, it is to be understood that various different modifications within the scope and spirit of the invention are possible. The invention is limited only by the scope of the appended claims.

What is claimed is:

1. A computer implemented method for providing simulated faults on a circuit design, the method comprising:
   receiving a layout and a schematic of a circuit design;
   using a computer, performing a simulation of the circuit design with a fault;
   storing a simulation result in a database;
   editing the layout and the schematic to include the fault; and
   linking the stored simulation result with the edited layout and the edited schematic.

2. The method of claim 1 wherein the receiving a layout and a schematic further comprises:
   combining the layout and the schematic into a single database and creating a namespace map between the layout, the schematic, and the single database.

3. The method of claim 2 wherein the receiving a layout and a schematic further comprises:
   creating a netlist and a list of faults from the single database while maintaining the same namespace.

4. The method of claim 3 further comprising:
   displaying the simulation result in a table of selectable faults or as a waveform selectable on a display in a graphical user interface; and
   displaying the edited layout or the edited schematic.

5. The method of claim 4 wherein the linking the stored simulation result with the edited layout and the edited schematic comprises:
   retrieving the fault in the simulation from the list of faults;
   using the namespace map to map the fault from the list of faults to the schematic or the layout; and
   editing the layout or the schematic to include the fault.

6. The method of claim 5 wherein the linking the stored simulation result with the edited layout and the edited schematic further comprises:
   identifying the fault on the schematic or the layout when receiving a selection of the waveform or the fault.

7. The method of claim 5 wherein the linking the stored simulation result with the edited layout and the edited schematic further comprises:
   identifying the waveform or the fault in the list of faults on the graphical user interface when receiving a selection of the fault in the schematic or the layout.

8. A non-transitory computer readable medium storing instructions that, when executed by a processor, cause the processor to perform a method for providing simulated faults on a circuit design, the method comprising:
   receiving a layout and a schematic of a circuit design;
   performing a simulation of the circuit design with a fault;
   storing a simulation result in a database;
   editing the layout and the schematic to include the fault;

linking the stored simulation result with the edited layout and the edited schematic.

9. The method of claim 8 wherein the receiving a layout and a schematic further comprises:
combining the layout and the schematic into a single database and creating a namespace map between the layout, the schematic, and the single database.

10. The method of claim 9 wherein the receiving a layout and a schematic further comprises:
creating a netlist and a list of faults from the single database while maintaining the same namespace.

11. The method of claim 10 further comprising:
displaying the simulation result in a table of selectable faults or as a selectable waveform selectable on a display in a graphical user interface; and
displaying the edited layout or the edited schematic.

12. The method of claim 11 wherein the linking the stored simulation result with the edited layout and the edited schematic comprises:
retrieving the fault in the simulation from the list of faults;
using the namespace map to map the fault from the list of faults to the schematic or the layout; and
editing the layout or the schematic to include the fault.

13. The method of claim 12 wherein the linking the stored simulation result with the edited layout and the edited schematic further comprises:
identifying the fault on the schematic or the layout when receiving a selection of the waveform or the fault.

14. The method of claim 12 wherein the linking the stored simulation result with the edited layout and the edited schematic further comprises:
identifying the waveform or the fault in the list of faults on the graphical user interface when receiving a selection of the fault in the schematic or the layout.

15. A system for providing simulated faults on a circuit design, the system comprising:
a non-transitory computer-readable medium to store a layout and a schematic of a circuit design;
a processor executing instructions to:
perform a simulation of the circuit design with a fault;
store a simulation output in a database;
edit the layout and the schematic to include the fault;
link the stored simulation output with the edited layout and the edited schematic.

16. The system of claim 15 wherein the instructions further comprise instructions to:
combine the layout and the schematic into a single database and create a namespace map between the layout, the schematic, and the single database.

17. The system of claim 16 wherein the instructions further comprise instructions to:
create a netlist and a list of faults from the single database while maintaining the same namespace.

18. The system of claim 17 wherein the instructions further comprise instructions to:
display the simulation output in a table of selectable faults or as a waveform selectable on a display in a graphical user interface; and
display the edited layout or the edited schematic.

19. The system of claim 18 wherein the instructions to link the stored simulation output with the edited layout and the edited schematic comprise instructions to:
retrieve the fault in the simulation from the list of faults;
use the namespace map to map the fault from the list of faults to the schematic or the layout; and
edit the layout or the schematic to include the fault.

20. The system of claim 19 wherein the instructions to link the stored simulation output with the edited layout and the edited schematic further comprise instructions to:
identify the fault on the schematic or the layout when receiving a selection of the waveform or the fault.

* * * * *

UNITED STATES PATENT AND TRADEMARK OFFICE
CERTIFICATE OF CORRECTION

| | | |
|---|---|---|
| PATENT NO. | : 8,813,004 B1 | Page 1 of 1 |
| APPLICATION NO. | : 13/683889 | |
| DATED | : August 19, 2014 | |
| INVENTOR(S) | : Donald J. O'Riordan et al. | |

It is certified that error appears in the above-identified patent and that said Letters Patent is hereby corrected as shown below:

In the Claims,
Col. 7, line 14, delete "selectable" (first occurrence).

Signed and Sealed this
Second Day of December, 2014

Michelle K. Lee
*Deputy Director of the United States Patent and Trademark Office*